(12) United States Patent
Katoh et al.

(10) Patent No.: US 9,770,842 B2
(45) Date of Patent: Sep. 26, 2017

(54) CUTTING APPARATUS

(71) Applicant: DISCO CORPORATION, Tokyo (JP)

(72) Inventors: Kei Katoh, Tokyo (JP); Chengtai Bai, Tokyo (JP)

(73) Assignee: Disco Corporation, Tokyo (JP)

( * ) Notice: Subject to any disclaimer, the term of this patent is extended or adjusted under 35 U.S.C. 154(b) by 9 days.

(21) Appl. No.: 14/936,993

(22) Filed: Nov. 10, 2015

(65) Prior Publication Data

US 2016/0136843 A1 May 19, 2016

(30) Foreign Application Priority Data

Nov. 18, 2014 (JP) ................. 2014-233666

(51) Int. Cl.
| | | |
|---|---|---|
| *B28D 5/00* | (2006.01) | |
| *B28D 5/02* | (2006.01) | |
| *H01L 21/67* | (2006.01) | |
| *B28D 1/04* | (2006.01) | |
| *H01L 21/68* | (2006.01) | |
| *B24B 49/12* | (2006.01) | |
| *B24B 49/04* | (2006.01) | |

(52) U.S. Cl.
CPC .......... *B28D 5/0064* (2013.01); *B28D 1/044* (2013.01); *B28D 5/0082* (2013.01); *B28D 5/022* (2013.01); *H01L 21/67092* (2013.01); *H01L 21/67259* (2013.01); *H01L 21/681* (2013.01); *B24B 49/04* (2013.01); *B24B 49/12* (2013.01)

(58) Field of Classification Search
CPC ....... B24B 49/04; B24B 49/045; B24B 49/05; B24B 49/12; B28D 1/04; B28D 1/044; B28D 1/047; B28D 1/066; B28D 5/0064; B28D 5/0082; B28D 5/023
See application file for complete search history.

(56) References Cited

U.S. PATENT DOCUMENTS

| | | | | |
|---|---|---|---|---|
| 5,087,121 A | * | 2/1992 | Kakuchi ................ | G01B 11/22 356/626 |
| 6,421,456 B1 | * | 7/2002 | Son ...................... | B28D 5/0064 257/E21.238 |
| 6,776,078 B2 | * | 8/2004 | Gawazawa ............ | B28D 5/023 125/13.01 |

(Continued)

FOREIGN PATENT DOCUMENTS

| | | |
|---|---|---|
| JP | 2005-064231 | 3/2005 |
| JP | 2010-010445 | 1/2010 |

*Primary Examiner* — Timothy V Eley
(74) *Attorney, Agent, or Firm* — Greer Burns & Crain Ltd.

(57) ABSTRACT

A cutting apparatus includes a width measuring unit for measuring the width of a grooving groove formed in a wafer by laser grooving and the width of a cut groove formed by a cutting blade. The width measuring unit includes an imaging camera for imaging the grooving groove and the cut groove, and an illuminating unit for illuminating an area to be imaged by the imaging camera with light supplied in a predetermined light quantity. Therefore, when first light is radiated from the illuminating unit, a first image in which the grooving groove is sharply imaged can be imaged by the imaging camera, whereas when second light is radiated from the illuminating unit, a second image in which the cut groove is clearly imaged can be imaged by the imaging camera. Consequently, the grooving groove and the cut groove can be easily distinguished from each other.

1 Claim, 5 Drawing Sheets

(56) References Cited

U.S. PATENT DOCUMENTS

| | | | | |
|---|---|---|---|---|
| 7,064,046 B2* | 6/2006 | Wakui | ................... | H01L 21/78 257/E21.599 |
| 9,010,225 B2* | 4/2015 | Hojo | ..................... | B24B 49/12 438/462 |
| 2014/0083270 A1* | 3/2014 | Farnworth | ........... | B28D 5/0064 83/76.8 |

* cited by examiner

CUTTING APPARATUS

BACKGROUND OF THE INVENTION

Field of the Invention

The present invention relates to a cutting apparatus for cutting a wafer formed with a low-k film on a front side thereof so as to divide the wafer into individual chips.

Description of the Related Art

In recent years, for enhancing processing capability of devices such as ICs and LSIs, a wafer provided on a front side thereof with a laminate adopting a low dielectric constant insulator film (low-k film) as an interlayer dielectric film has been put to practical use. This type of wafer is divided into individual device chips, before being utilized for a variety of electrical apparatuses such as mobile phones and personal computers. In relation to dividing the wafer formed with a low-k film on the front side thereof, there has been proposed a method of dividing a wafer into individual chips wherein grooves are formed in the low-k film along division lines by grooving by irradiation with laser (laser grooving) (the grooves thus formed by grooving will hereinafter be referred to as "grooving grooves"), and a cutting blade is made to cut the wafer along the grooving grooves, thereby dividing the wafer into the individual chips (see, for example, Japanese Patent Laid-open No. 2005-064231).

Side surface portions of each grooving groove thus formed by cutting of the low-k film are very brittle. When the cutting blade is made to cut into the wafer along the grooving groove, therefore, the cutting blade may come into contact with the low-k film present at each side surface of the grooving groove to cause peeling of the low-k film, thereby possibly damaging the devices. For avoiding the contact of the cutting blade with the low-k film, therefore, a method has been proposed wherein the width of the grooving groove is measured, and the cutting blade is positioned at the center of the width of the grooving groove, before starting the cutting (see, for example, Japanese Patent No. 5254681). In the case where the center of the groove formed by cutting in such a method (the groove formed by cutting with a cutting blade will hereinafter be referred to as "cut groove") is positionally deviated from the center of the grooving groove, it is necessary to correct the cutting position at the time of the next cutting operation. For this reason, after cutting by the cutting blade, the width of the cut groove is measured to determine the position of the center of the cut groove, whereby it is checked whether the cut groove has been formed in the center of the grooving groove.

SUMMARY OF THE INVENTION

In recent years, however, there is a trend toward smaller-width division lines for obtaining more chips from a wafer. Therefore, the difference between the width of the grooving grooves formed along the division lines and the width of the cut grooves also formed along the division lines, which difference was 5 to 10 μm in the past, has come to be as small as 2 to 4 μm in recent years. Accordingly, it has become difficult to detect the grooving groove and the cut groove distinctly from each other. Thus, there is a problem that it is impossible to correct the position of the cutting blade so as to position the cutting blade at the center of the grooving groove with high accuracy.

Accordingly, it is an object of the present invention to make it possible to easily distinguish a grooving groove and a cut groove from each other and to cut the center of the grooving groove by a cutting blade.

In accordance with an aspect of the present invention, there is provided a cutting apparatus for cutting a wafer formed with grooving grooves through application of a laser beam along a plurality of division lines which partition a plurality of devices from each other. The cutting apparatus includes: a chuck table adapted to hold the wafer thereon; cutting means for cutting the wafer held on the chuck table along each of the grooving grooves by a cutting blade; indexing means for indexing the cutting means and the chuck table relative to each other in an indexing direction; and width measuring means for measuring a width of the grooving groove and a width of a cut groove. The width measuring means includes an imaging camera for imaging the grooving groove and the cut groove, and illuminating means for illuminating an area to be imaged by the imaging camera. The illuminating means includes a light quantity switching section by which first light having a first light quantity when the imaging camera images the grooving groove and second light having a second light quantity when the imaging camera images the cut groove are switched over. The cutting apparatus further includes: a detection unit for detecting a positional deviation of the cut groove from the grooving groove, on the basis of a first image picked up by the imaging camera using the first light and a second image picked up by the imaging camera using the second light; and a control unit for controlling the indexing means on the basis of the positional deviation detected by the detection unit so as thereby to make a width-directional center of the grooving groove and a width-directional center of the cut groove coincide with each other.

The cutting apparatus according to the aspect of the present invention includes the width measuring means for measuring the width of the grooving groove formed in the wafer by laser grooving and the width of the cut groove formed in the wafer by the cutting blade. The width measuring means includes the imaging camera for imaging the grooving groove and the cut groove, and the illuminating means for illuminating an imaging area to be imaged by the imaging camera with a predetermined quantity of light. The illuminating means emits the first light in a quantity necessary for imaging the grooving groove at the time of imaging the grooving groove, and emits the second light in a quantity necessary for imaging the cut groove at the time of imaging the cut groove. Therefore, the imaging camera can pick up a first picked-up image in which the grooving groove is clearly imaged and a second picked-up image in which the cut groove is sharply imaged. Accordingly, the grooving groove and the cut groove can be easily distinguished from each other.

Besides, the cutting apparatus further includes the detection unit for detecting the positional deviation of the cut groove from the grooving groove on the basis of the first picked-up image and the second picked-up image, and the control unit for controlling the indexing means on the basis of the positional deviation detected by the detection unit so as to make the center of the width of the grooving groove and the center of the width of the cut groove coincide with each other. For this reason, the width-directional center of the cutting blade can be positioned at the width-directional center of the grooving groove with high accuracy. Consequently, the width-directional center of the grooving groove can be cut by the cutting blade.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
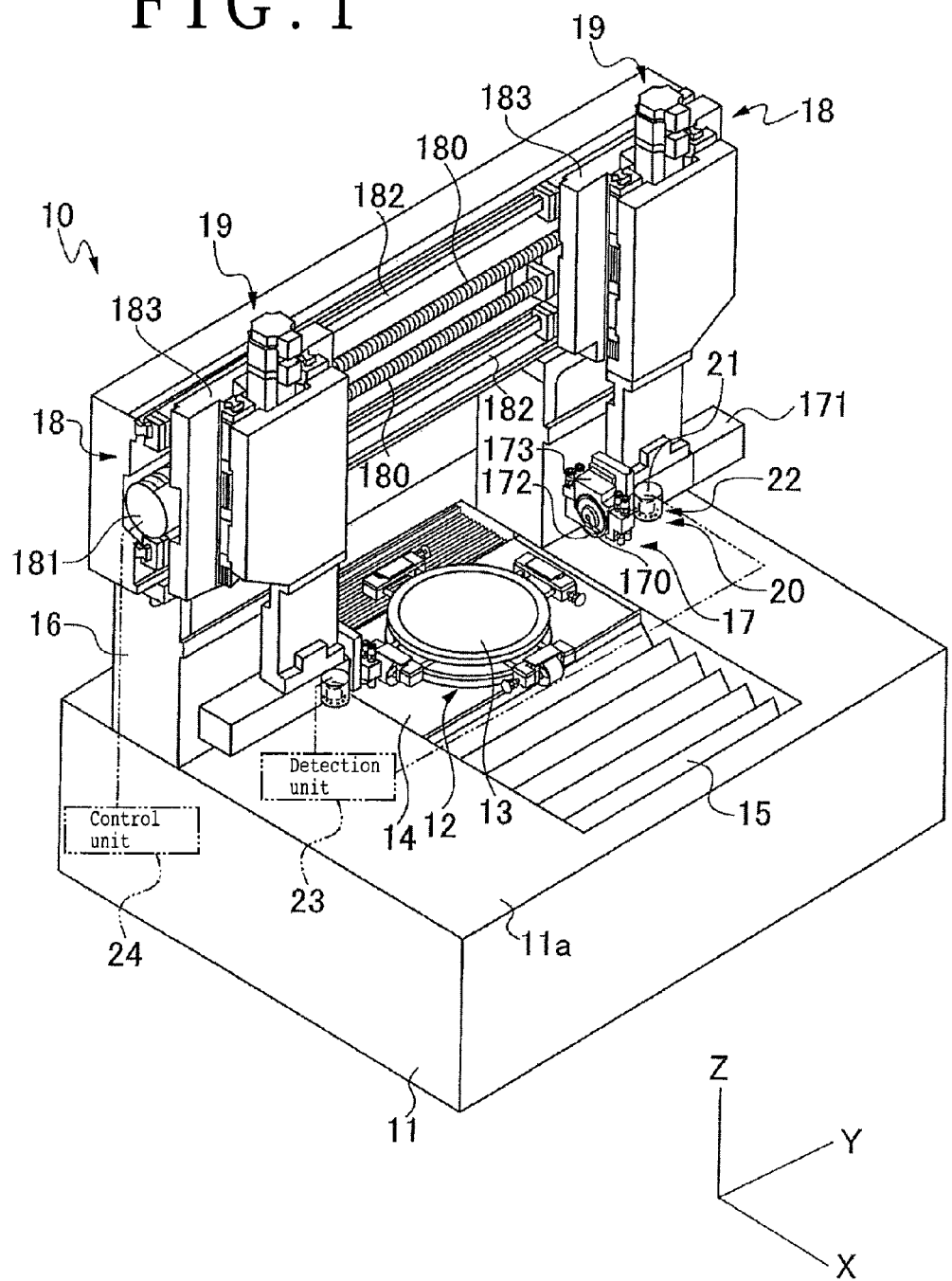
FIG. 1 is a perspective view showing an exemplary configuration of a cutting apparatus.

A cutting apparatus 10 shown in FIG. 1 has an apparatus base 11. On an upper surface 11a of the apparatus base 11 is disposed a chuck table 12 which has a holding surface 13 for holding thereon a wafer as a workpiece. A cover 14 is disposed in the periphery of the chuck table 12, and an expandable bellows 15 is connected to the cover 14.

A gate-formed column 16 is erected at the rear of the apparatus base 11. The column 16 is provided with: two cutting means 17 for cutting the wafer; two indexing means 18 for indexing the cutting means 17 and the chuck table 12 relative to each other in an indexing direction (Y-axis direction); two lifting means 19 for lifting the cutting means 17 up and down in a Z-axis direction; and two width measuring means 20 which are mounted respectively to the cutting means 17 and measure the widths of a cut groove and the like formed in the wafer by machining by the cutting means 17. The width measuring means 20 can not only measure the width of the cut groove but also measure the width of a grooving groove in the case where the wafer is formed therein with a grooving groove or grooves by laser processing.

Each of the two cutting means 17 includes a spindle 170 having an axis in a Y-axis direction, a spindle housing 171 surrounding the spindle 170 so that the spindle 170 can be rotated, a cutting blade 172 mounted to a tip of the spindle 170, and a blade cover 173 covering the cutting blade 172 so that the cutting blade 172 can be rotated.

Each of the two indexing means 18 includes a ball screw 180 extending in the Y-axis direction, a motor 181 connected to a tip of the ball screw 180, a guide rail 182 extending in parallel to the ball screw 180, and a guide plate 183 for moving the cutting means 17 in the Y-axis direction. Each guide rail 182 is in sliding contact with a side portion of the guide plate 183, and the ball screw 180 is in screw engagement with a nut formed at a central portion of the guide plate 183. With the ball screw 180 driven by the motor 181 to rotate, the cutting means 17 can be indexed in the Y-axis direction together with the guide plate 183. The lifting means 19 for lifting the cutting means 17 up and down in the Z-axis direction are connected to the guide plates 183, respectively.

Each of the width measuring means 20 includes: an imaging camera 21 for imaging a grooving grove formed by laser grooving in a laser processing apparatus (not shown) and a cut groove formed by the cutting blade 172; and illuminating means 22 for illuminating an imaging area to be imaged by the imaging camera 21 with a predetermined quantity of light. The imaging camera 21 includes, for example, a CCD image sensor or a CMOS image sensor.

Figure 2:
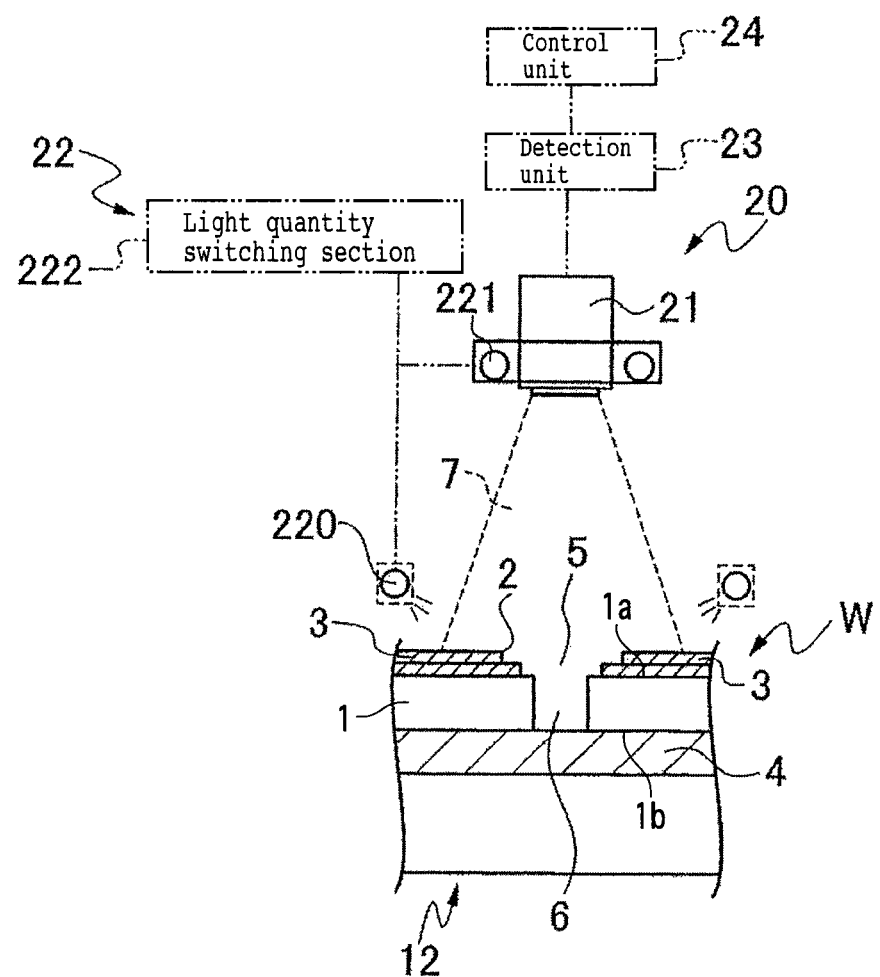
FIG. 2 is a sectional view showing how a grooving groove is imaged by an imaging camera.

As shown in FIG. 2, the illuminating means 22 includes a first light emitting section 220, a second light emitting section 221, and a light quantity switching section 222 for switching over the quantity of light emitted from the illuminating means 22. The second light emitting section 221 is disposed in the periphery of the imaging camera 21, and can cast light on the imaging area. On the other hand, the first light emitting section 220 is disposed below the second light emitting section 221, and can cast light on the imaging area from an oblique upper side.

To the width measuring means 20 are connected a detection unit 23 and a control unit 24. The detection unit detects a positional deviation of the cut groove from the grooving groove, on the basis of a first image picked up by the imaging camera 21 utilizing first light and a second image picked up by the imaging camera 21 utilizing second light, and specifically through, for example, superposing the first image and the second image on each other. The control unit 24 controls the indexing means 18, shown in FIG. 1, on the basis of the positional deviation detected by the detection unit 23. The control unit 24 includes at least a CPU and a memory, and can store the positional deviation detected by the detection unit 23.

In the cutting apparatus 10, the wafer W is divided into individual chips by the cutting means 17. The wafer W has a circular disk-shaped substrate 1. A front side 1a of the substrate 1 is partitioned into regions by crossing division lines 2, and devices are formed in the regions. Besides, as shown in FIG. 2, the front side 1a of the substrate 1 is coated with a plurality of low-k films 3 formed in a stacked manner on surfaces of the devices. A tape 4 is attached to a back side 1b of the substrate 1, and the back side 1b constitutes a surface to be held onto the holding surface 13 of the chuck table 12 through the tape 4 therebetween.

Before dividing the wafer W into the chips, laser grooving is conducted along the division lines 2 by use of a laser processing apparatus (not shown), for example. By this, grooving grooves 5 are formed so as to cut the low-k films 3 formed on the front side 1a of the wafer W as shown in FIG. 2.

Next, cut grooves are formed along the grooving grooves 5 on the front side 1a of the wafer W by the cutting means 17 shown in FIG. 1, so as to divide the wafer W into individual chips. Specifically, the wafer W is held on the holding surface 13 of the chuck table 12, and the chuck table 12 is moved to a position under the cutting means 17.

In an operation of the cutting means 17, while the cutting blade 172 is rotated at a predetermined rotational speed by rotating the spindle 170, the cutting means 17 is lowered along the Z-axis direction, for approaching the front side 1a of the wafer W held on the chuck table 12, by the lifting means 19. Subsequently, the cutting blade 172 is made to cut along the grooving grooves 5 (shown in FIG. 2) so as to remove the low-k films 3, thereby forming cut grooves 6 along the grooving grooves 5. Note that the width of the grooving grooves 5 is set to be not less than the width of the cut grooves 6.

While indexing of the cutting means 17 in the Y-axis direction is conducted by each indexing means 18, the wafer W is cut by the cutting blade 172 along the grooving groove 5 on the division line 2 directed in the X-axis direction. Next, in the cutting apparatus 10, a positional deviation of the cut groove 6 from the grooving groove 5 formed in the wafer w is detected, and the position of the cutting blade 172 is adjusted so that the width-directional center of the grooving groove 5 and the width-directional center of the cut groove 6 coincide with each other.

First, the width of the grooving groove 5 and the width of the cut groove 6 are measured by use of the width measuring means 20. Specifically, as illustrated in FIG. 2, the width measuring means 20 is moved to a position on the upper side of an imaging area 7, and the grooving groove 5 is imaged by the imaging camera 21. Note that the imaging area 7 is set to be within that range of the front side 1a of the wafer W in which the grooving groove 5 and the cut groove 6 are formed along the division line 2.

At the time of measuring the width of the grooving groove 5 and the width of the cut groove 6 by the imaging camera 21, imaging is conducted by switching over first light and second light by the light quantity switching section 222. The first light and the second light are formed by regulating the quantities of light supplied from the first light emitting section (oblique illumination) 220 and the second light emitting section (downward illumination) 221. Specifically, the first light and the second light are formed by regulating the ratio between the quantity of light relevant to the first light emitting section (oblique illumination) 220 and the quantity of light relevant to the second light emitting section (downward illumination) 221. For example, the first light is formed by setting the light quantity of the first light emitting section (oblique illumination) 220 to 60% and setting the light quantity of the second light emitting section (downward illumination) 221 to 30%; on the other hand, the second light is formed by setting the light quantity of the first light emitting section (oblique illumination) 220 to 10% and setting the light quantity of the second light emitting section (downward illumination) 221 to 25%.

When the grooving groove 5 is imaged by the imaging camera 21, the first light emitting section (oblique illumination) 220 is made to emit light strongly on a lateral side of the imaging area 7 and on an oblique upper side of the division line 2, whereby the imaging area 7 is illuminated with the first light. Then, the imaging area 7 thus illuminated brightly is imaged by the imaging camera 21.

Therefore, the first light is reflected by the upper surface of the wafer W in the area where the device is formed, so that a white image is picked up. On the other hand, at the grooving groove 5 and the cut groove 6 which are lower than the upper surface of the wafer W, the first light is reflected little, so that a dark image is picked up. As a result, a first picked-up image 100 can be obtained in which a boundary 50 between the grooving groove 5 and its outside is clearly imaged on the inside of the division line 2, as shown in FIG. 3.

Figure 4:
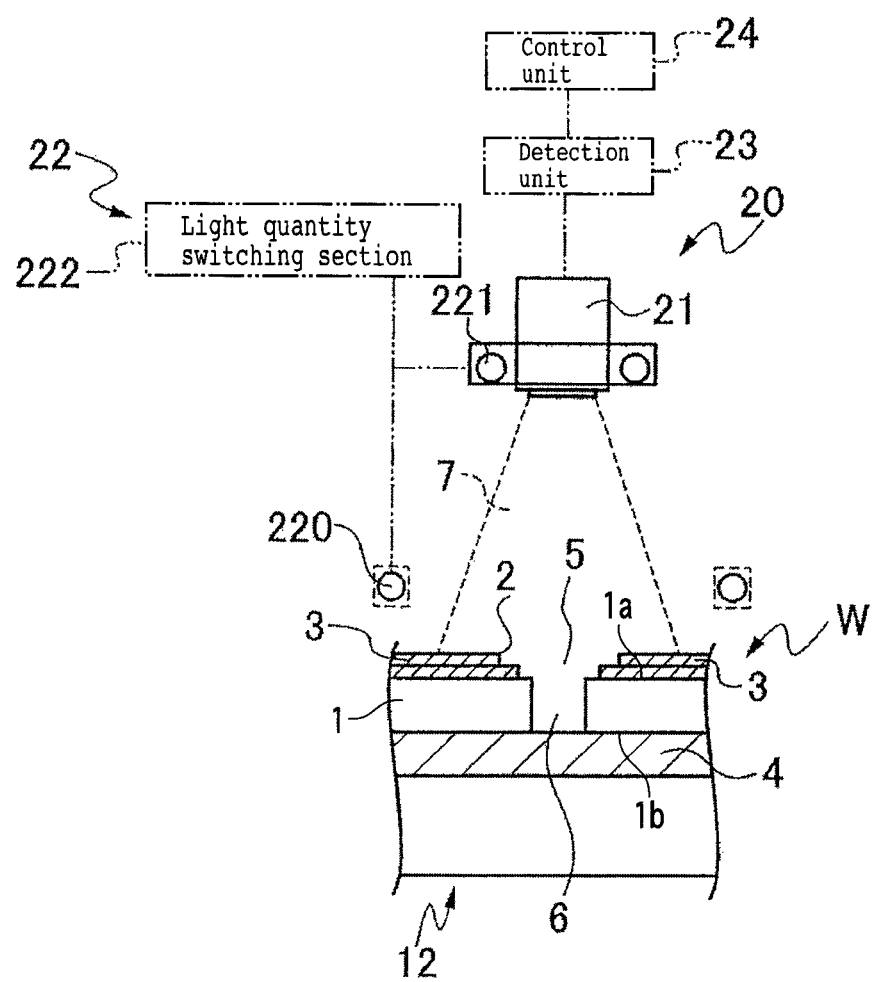
FIG. 4 is a sectional view showing how a cut groove is imaged by the imaging camera.
Figure 5:
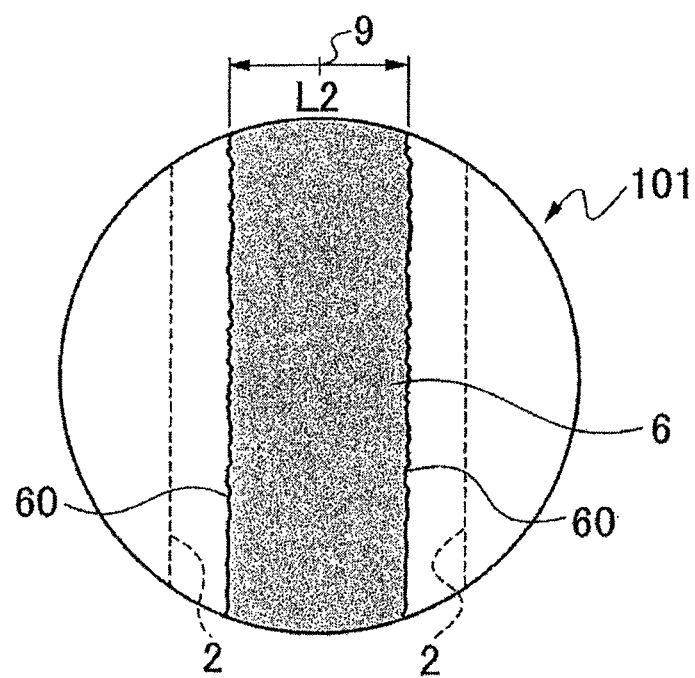
FIG. 5 is an enlarged view of a second image into which the cut groove is imaged.

Next, as depicted in FIG. 4, the light quantity switching section 222 switches from the first light to the second light, and the cut groove 6 is imaged by the imaging camera 21. In this instance, the illuminating means 22 causes light to be emitted toward the division line 2 in a condition in which the light quantity of the second light emitting section 221 is greater than the light quantity of the first light emitting section 220. Then, the imaging area 7 is imaged by the imaging camera 21. As a result, a second picked-up image 101 can be obtained in which a boundary 60 between the cut groove 6 and its outside is sharply imaged on the inside of the division line 2, as shown in FIG. 5. In this way, the grooving groove 5 and the cut groove 6 can be distinguished from each other.

The detection unit 23 determines the width L1 of the grooving groove 5 in the first picked-up image 100 and the width L2 of the cut groove 6 in the second picked-up image 101 by image processing. The width L1 of the grooving groove 5 and the width L2 of the cut groove 6 can be determined, for example, on the basis of the number of pixels between the left and right boundaries 50 and the number of pixels between the left and right boundaries 60, respectively. Since the grooving groove 5 and the cut groove 6 are formed in rugged shape, their widths are not constant. In view of this, the width measurement is conducted at a plurality of locations in the picked-up images, and the width values of the widest portions are detected as the widths L1 and L2. Then, for the groove widths L1 and L2, intermediate points of the widths are determined by calculation, and the relevant positions are taken as the center 8 of the width L1 of the grooving groove 5 and the center 9 of the width L2 of the cut groove 6.

Figure 3:
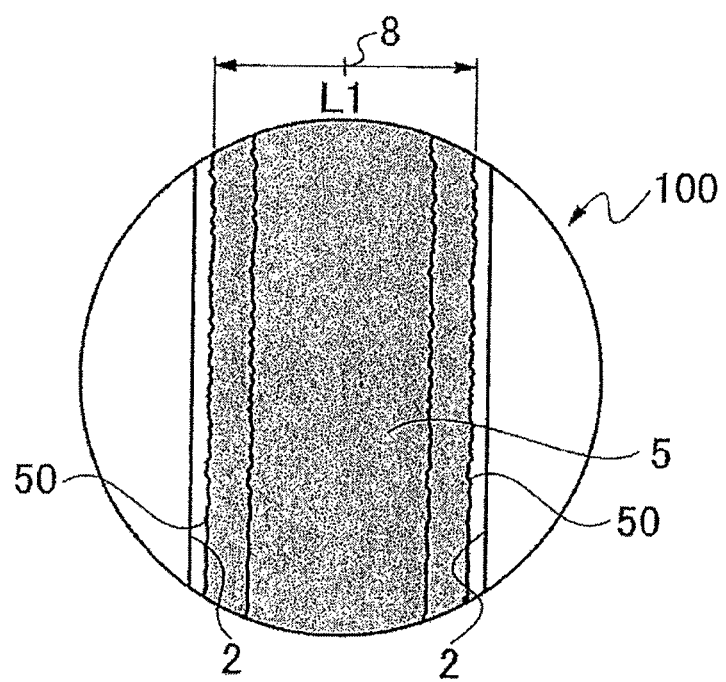
FIG. 3 is an enlarged view of a first image into which the grooving groove is imaged.

Next, the first picked-up image 100 shown in FIG. 3 and the second picked-up image 101 shown in FIG. 5 are superposed on each other, and the degree in which the center 8 of the width L1 of the grooving groove 5 and the center 9 of the width L2 of the cut groove 6 are positionally deviated from each other is detected as a positional deviation of the cut groove 6 from the grooving groove 5.

On the basis of the positional deviation detected by the detection unit 23, the control unit 24 controls the two indexing means 18 (shown in FIG. 1) at the time of cutting along the next division line. The indexing means 18 moves the cutting means 17 in the Y-axis direction by the positional deviation detected so as to correct the position of the cutting blade 172 in the Y-axis direction, and position the width-directional center of the cutting blade 172 (shown in FIG. 1) at the center 8 of the width L1 of the grooving groove 5 shown in FIG. 3, thereby making the center 8 of the width L1 of the grooving groove 5 and the center 9 of the width L2 of the cut groove 6 coincide with each other. In this manner, the position of the cutting blade 172 is adjusted so that the width-directional center of the grooving groove 5 can be cut by the cutting blade 172. Then, cutting of the wafer is conducted with the cutting blade 172 positioned at the adjusted position, whereby the cut groove can be formed in the width-directional center of the grooving groove 5. Therefore, it is possible to avoid a situation in which the cutting blade 172 comes into contact with the low-k film 3 present at each side surface of the grooving groove 5 with the result of peeling of the low-k film 3.

As has been described above, the cutting apparatus 10 includes the width measuring means 20 for measuring the width of the grooving groove 5 formed in the wafer W by laser grooving and the width of the cut groove 6 formed in the wafer W by the cutting blade 172. The width measuring means 20 includes the imaging camera 21 for imaging the grooving groove 5 and the cut groove 6, and the illuminating means 22 for illuminating the imaging area 7 to be imaged by the imaging camera 21 with a predetermined quantity of light. Therefore, when the illuminating means 22 is made to emit the first light necessary for imaging the grooving groove 5, the first picked-up image 100 in which the grooving groove 5 is sharply imaged can be picked up by the imaging camera 21. When the illumination means 22 is made to emit the second light necessary for imaging the cut groove 6, the second picked-up image 101 in which the cut groove 6 is clearly imaged can be picked up by the imaging camera 21.

In this way, the grooving groove 5 and the cut groove 6 can be easily distinguished from each other. For this reason, the positional deviation of the cut groove 6 from the grooving groove 5 can be detected through superposing the first picked-up image 100 and the second picked-up image 101 by the detection unit 23. With the indexing means 18 controlled by the control unit 24 on the basis of the positional deviation detected by the detection unit 23, the position of the cutting blade 172 can be adjusted so that the center 8 of the outermost width L1 of the grooving groove 5 and the center 9 of the width L2 of the cut groove 6 will coincide with each other with high accuracy. Consequently, the wafer W can be favorably divided into individual chips.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A cutting apparatus for cutting a wafer formed with grooving grooves through application of a laser beam along a plurality of division lines which partition a plurality of devices from each other, the cutting apparatus comprising:
    a chuck table adapted to hold the wafer thereon;
    cutting means including a blade for cutting the wafer held on the chuck table along each of the grooving grooves;
    indexing means for indexing the cutting means and the chuck table relative to each other in an indexing direction; and
    width measuring means for measuring a width of the grooving groove and a width of a cut groove,
    wherein the width measuring means includes an imaging camera for imaging the grooving groove and the cut groove, and illuminating means for illuminating an area to be imaged by the imaging camera,
    the illuminating means includes a light quantity switching section by which first light having a first light quantity when the imaging camera images the grooving groove and second light having a second light quantity when the imaging camera images the cut groove are switched over, and
    the cutting apparatus further comprises:
    a detection unit for detecting a positional deviation of the cut groove from the grooving groove, on the basis of a first image picked up by the imaging camera using the first light and a second image picked up by the imaging camera using the second light; and
    a control unit for controlling the indexing means on the basis of the positional deviation detected by the detection unit so as thereby to make a width-directional center of the grooving groove and a width-directional center of the cut groove coincide with each other.

* * * * *